United States Patent
Barnard et al.

[19]

[11] Patent Number: 5,951,769
[45] Date of Patent: Sep. 14, 1999

[54] METHOD AND APPARATUS FOR MAKING HIGH REFRACTIVE INDEX (HRI) FILM

[75] Inventors: Gary S. Barnard, Ringwood, N.J.; Joseph R. Gervais, North Gramby, Conn.

[73] Assignee: Crown Roll Leaf, Inc., Patterson, N.J.

[21] Appl. No.: 08/869,076

[22] Filed: Jun. 4, 1997

[51] Int. Cl.[6] .............................. C23C 14/24; C23C 14/56
[52] U.S. Cl. ........................ 118/718; 118/720; 118/726; 118/728; 427/255.5
[58] Field of Search ..................... 118/718, 720, 118/726, 728; 427/255.5, 162; 204/298.11

[56] References Cited

U.S. PATENT DOCUMENTS

| | | |
|---|---|---|
| 3,552,853 | 1/1971 | Sanders et al. . |
| 3,578,845 | 5/1971 | Brooks et al. . |
| 3,580,657 | 5/1971 | Sheridon . |
| 3,703,407 | 11/1972 | Hannan et al. . |
| 3,790,245 | 2/1974 | Hannan et al. . |
| 3,858,977 | 1/1975 | Baird et al. . |
| 3,869,301 | 3/1975 | Decker et al. . |
| 3,887,742 | 6/1975 | Reinnagel . |
| 3,939,798 | 2/1976 | Morton ..................................... 118/726 |
| 4,014,602 | 3/1977 | Ruell . |
| 4,034,211 | 7/1977 | Horst et al. . |
| 4,043,748 | 8/1977 | Watanabe et al. ....................... 118/726 |
| 4,045,125 | 8/1977 | Farges . |
| 4,168,346 | 9/1979 | Pezzoli . |
| 4,217,856 | 8/1980 | Kraus ..................................... 118/726 |
| 4,269,473 | 5/1981 | Flothmann et al. . |
| 4,330,604 | 5/1982 | Wreede et al. . |
| 4,389,472 | 6/1983 | Neuhaus et al. . |
| 4,403,002 | 9/1983 | Akashi et al. .......................... 118/726 |
| 4,416,217 | 11/1983 | Nakamura et al. ..................... 118/720 |
| 4,419,436 | 12/1983 | Kranser . |
| 4,501,439 | 2/1985 | Antes . |
| 4,526,132 | 7/1985 | Ohta ..................................... 118/726 |
| 4,544,835 | 10/1985 | Drexler . |
| 4,563,024 | 1/1986 | Blyth . |
| 4,565,158 | 1/1986 | Koprio ..................................... 118/726 |
| 4,579,083 | 4/1986 | Boivin ..................................... 118/726 |
| 4,582,431 | 4/1986 | Cole . |
| 4,597,814 | 7/1986 | Colgate, Jr. . |
| 4,631,222 | 12/1986 | Sander . |
| 4,646,680 | 3/1987 | Maki ..................................... 118/726 |
| 4,681,780 | 7/1987 | Kamman ............................... 427/255.5 |

(List continued on next page.)

FOREIGN PATENT DOCUMENTS

| | | |
|---|---|---|
| 3422908 A1 | 1/1986 | Germany . |
| 631 920 | 9/1982 | Switzerland . |
| 2 181 993 | 5/1987 | United Kingdom . |

OTHER PUBLICATIONS

The Condensed Chemical Dictionary, Third Edition, 1981, 1112.

Kinney Engineering Bulletin, #4100.8, Feb. 15, 1960, by David H. Baum, pp. 1–8.

*Primary Examiner*—Shrive Beck
*Assistant Examiner*—Bret Chen
*Attorney, Agent, or Firm*—Woodcock Washburn Kurtz Mackiewicz & Norris, LLP

[57] ABSTRACT

This invention includes an apparatus for heating a deposition material to form a vapor that may be deposited on a polymer film and thereby create a holographic film or similar material. A system and a method for producing such a film is also provided. Included within this system is a vaporizer that has an adjustable aperture. By adjusting the size of the aperture, the flow rate of the vapor from the vaporizer can be adjusted to achieve a desired flow rate. A heat source in thermal communication with the vaporizer may also be employed in the system to heat the deposition material to form a vapor. The vaporizer may be disposed within a vacuum chamber, which has a feed roll and a take up roll. As film is transferred from the feed roll to the take up roll, the vapor is deposited on the film. With the vaporizer of this invention, feed rates of about 1,500 fpm have been achieved.

21 Claims, 3 Drawing Sheets

U.S. PATENT DOCUMENTS

| | | |
|---|---|---|
| 4,743,367 | 5/1988 | Shirahata et al. .................... 427/255.5 |
| 4,758,296 | 7/1988 | McGrew . |
| 4,837,044 | 6/1989 | Murarka et al. . |
| 4,839,250 | 6/1989 | Cowan . |
| 4,856,857 | 8/1989 | Takeuchi et al. . |
| 4,906,315 | 3/1990 | McGrew . |
| 4,921,319 | 5/1990 | Mallik . |
| 4,933,120 | 6/1990 | D'Amato et al. . |
| 4,953,497 | 9/1990 | Kessler . |
| 4,978,804 | 12/1990 | Woell . |
| 5,044,707 | 9/1991 | Mallik . |
| 5,083,850 | 1/1992 | Mallik et al. . |
| 5,093,538 | 3/1992 | Woell . |
| 5,107,791 | 4/1992 | Hirokawa et al. . |
| 5,128,779 | 7/1992 | Mallik . |
| 5,131,752 | 7/1992 | Yu et al. . |
| 5,145,212 | 9/1992 | Mallik . |
| 5,184,848 | 2/1993 | Itoh et al. . |
| 5,230,923 | 7/1993 | Hirokawa et al. .................... 427/255.5 |
| 5,351,142 | 9/1994 | Cueli . |
| 5,695,808 | 12/1997 | Cueli . |
| 5,781,316 | 7/1998 | Strahl et al. . |

METHOD AND APPARATUS FOR MAKING HIGH REFRACTIVE INDEX (HRI) FILM

BACKGROUND OF THE INVENTION

This invention relates to a method of manufacturing a high refractive index (HRI) film and an apparatus and a system for accomplishing such a method.

Typically, high refractive index film refers to a film that is semi-transparent to the human eye. It may be transparent when viewed from one angle, but not from another angle. Included within the uses of this type of film are decorative wrapping paper, diffraction gratings and holograms. Holograms create the appearance of a three-dimensional image from a two dimensional object. Among the many uses of holograms are identification cards, trading cards, such as those picturing sports players, credit cards, and artistic uses.

Conventionally, high refractive index film is manufactured by depositing a layer of material onto a transparent plastic film. This may be accomplished by exposing the film in a vacuum chamber to a vapor which deposits on the film to create a layer. The deposited layer causes the refraction. This layer may be deposited as the film is fed from a feed spool to a take up spool. This method of creating a high refractive index film is generally described in U.S. Pat. No. 5,107,791 issued to Hirokawa et al. and U.S. Pat. No. 5,351,142 issued to Cueli.

The material heated to form the deposition layer varies. For example, Hirokawa teaches heating a composition composed mainly of a combination of silicon and silicon oxide or silicon oxide alone. However, zinc sulfide may also be used. Conventionally, this material is placed in a crucible or bowl like structure and heated through conduction. This is explained in detail in Hirokawa. A crucible like structure has several disadvantages. For instance, since the top of a crucible is generally open and the walls of the crucible are generally perpendicular to the top of the crucible, the vapor produced from heating the deposition material can diffuse out of the crucible in an uncontrolled fashion. More particularly, as the vapor is formed it diffuses upward and then exits the crucible. Upon exiting the crucible, the vapor can diffuse in almost any direction. Experience with crucibles shows that the vapor diffuses outward in addition to upward. Since the film is disposed above the crucible, it is preferable that the vapor diffuse upward and not outward so that the vapor contacts the film and deposits on it. Vapor that diffuses outward slows the deposition rate onto the film. This slows the rate at which film can be transferred from the feed roll to the take up roll and the overall rate of production of HRI film.

Another drawback of bowl shaped crucibles is that when they are used in conjunction with zinc sulfide, the zinc sulfide tends to form a crusty like layer across the top of the crucible when it is heated. This occurs because the zinc sulfide pellets or tablets at the top of the crucible form a layer and become supported by the zinc sulfide pellets beneath the layer. This layer limits the flow rate of vapor from the crucible. As described above, this then slows the feed rate of film and the rate of production.

Conventional crucibles also have a fixed opening at the top. Because of this, the flow rate of vapor produced by the crucible cannot be adjusted easily. Rather, assuming the same amount of heat and deposition material, a new crucible would have to be manufactured with a different size opening at the top in order to produce the same flow rate. This is inefficient and costly, particularly since the flow rate may have to be varied depending on the specific characteristics of the vacuum chamber and system employed.

In addition to bowl like crucibles, continuous vaporizers have also been designed. Hirokawa, for example, teaches a vaporizer that has an opening at either axial end through which deposition material can be continuously fed. At one end, the deposition material is inserted into the vaporizer. It is pushed through the vaporizer and is heated. As it is heated, vapor is produced and exhausts through a fixed opening in the top of the vaporizer. Such a system also has its disadvantages. For instance, the opening in the vaporizer taught by Hirokawa is fixed and cannot be adjusted to vary the flow rate of vapor. In light of the prior art, an improved method of heating a deposition material is needed that is simple, yet allows the flow rate of vapor to be varied by adjusting the vaporizer. Furthermore, an apparatus and a system for accomplishing such a method is needed.

SUMMARY OF THE INVENTION

A system and an apparatus for heating a deposition material to form a vapor to be deposited on a film and thereby create a high refractive index film includes a heat source in thermal communication with a vaporizer. The heat source may be conventional electrical resistance. The vaporizer preferably has an adjustable aperture and a deposition material may be deposited therein. Upon heating the deposition material, it produces a vapor which flows through the aperture at the top of the vaporizer.

This aperture is preferably adjustable so that the flow rate of vapor from the vaporizer can be varied. Before assembling the vaporizer to the system, the size of the aperture can be varied to achieve the requisite flow rate. In a preferred embodiment of this invention, the vaporizer is flexible and can be adjusted to have an aperture of the desired size. After flexing the vaporizer to achieve the desired size of the aperture, the vaporizer can be assembled to the system. In order to achieve a higher flow rate the aperture may be increased in size, and conversely to decrease the flow rate the aperture can be made smaller.

The vaporizer also preferably has a width below the aperture greater than the width or size of the aperture. Furthermore, the width of the vaporizer may narrow, similar to a funnel, to direct the flow of vapor to the aperture. By funneling the flow of vapor and limiting the size of the aperture, the vapor is directed to flow generally in an upward direction. This should be contrasted with a heating element that is a conventional bowl like crucible or similar structure. In this structure the vapor can diffuse outward in addition to upward.

Zinc sulfide may be employed as the deposition material. The apparatus of this invention prevents or limits crusting of zinc sulfide across the cross-section of the apparatus, which occurs as described above in prior art heating elements. Specifically, since the heating element preferably has a circular cross-section, the zinc sulfide at the top tends to fall to the center of the heating element as it becomes crusty.

The apparatus of this invention may be employed in a system of this invention for forming high refractive index film and similar materials according to a preferred method of this invention. Included within this system and method may be a vacuum chamber in which the vaporizer is disposed below film wrapped on a feed roll and a take up roll. The film is transferred from the feed roll to the take up roll. As this occurs, the depositing material is heated to form a vapor. The vapor diffuses upward through the aperture and deposits on the film. Conventionally, the rate of transferring film, while depositing the layer on the film, was about 40 feet per minute (fpm) and the maximum rate has proven to be about 600 fpm. Through the use of this invention, the rate of production has improved drastically. Feed rates of about 1,500 fpm have been achieved.

DETAILED DESCRIPTION OF THE PREFERRED EMBODIMENTS

Figure 1:
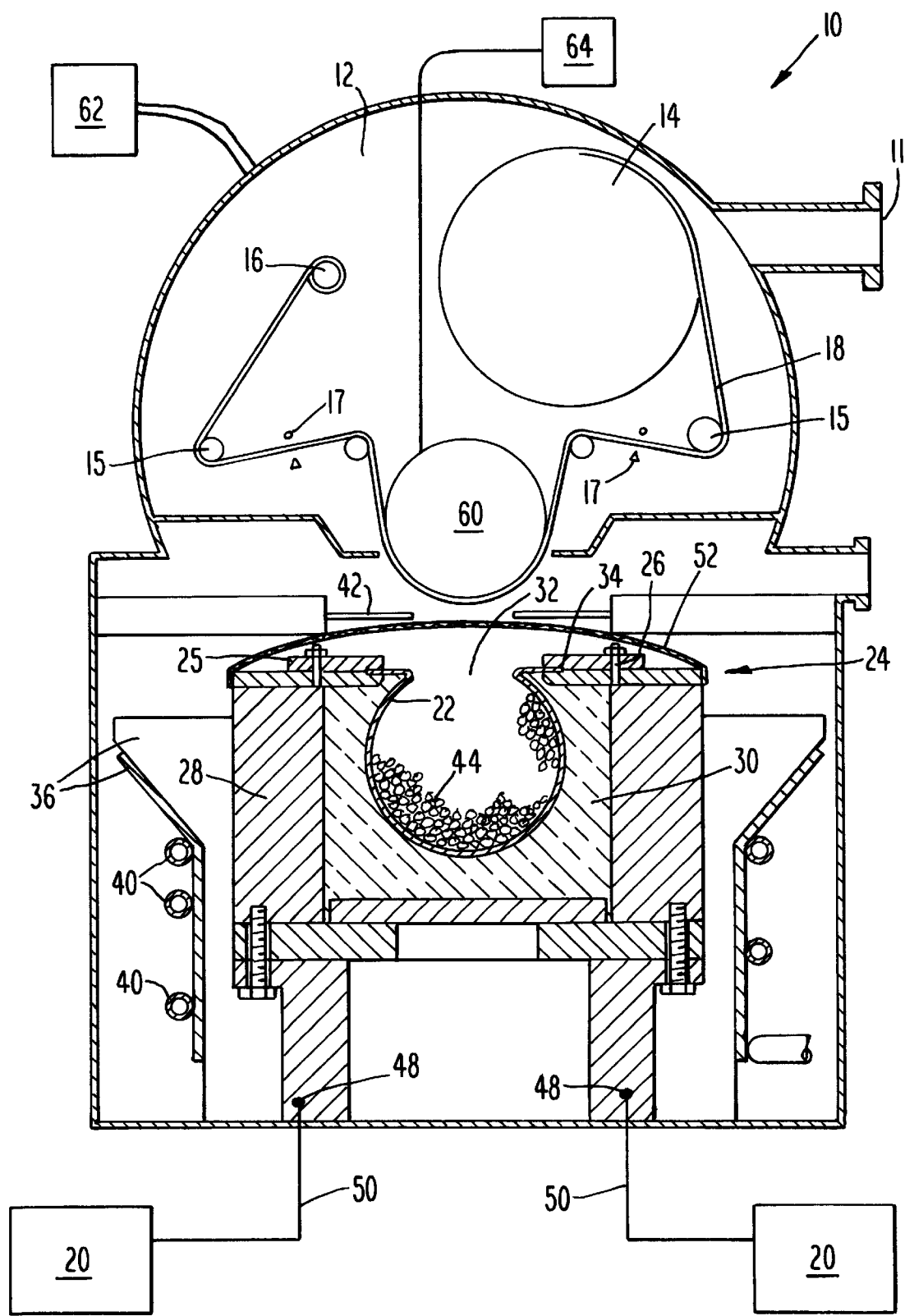
FIG. 1 is a diagrammatical sketch of a system and an apparatus according to a preferred embodiment of this invention.

Referring now to the drawings wherein like reference numerals designate corresponding structure throughout the views there is shown in FIG. 1 a preferred embodiment of a system and apparatus for manufacturing high refractive index film, diffraction gratings or similar materials. As described above, high refractive index film generally includes a multi-layer semi-transparent structure. Furthermore, the refraction index varies through the layers. The varying of the refraction index through the film creates the appearance of a three-dimensional object from a two dimensional image.

The system 10 according to a preferred embodiment includes the vacuum chamber 12, a feed roll 14 and a take up roll 16. Attached to the vacuum chamber 12 may be a vacuum pump 62 that operates to create the requisite pressure in the vacuum chamber 12. Pressure within the vacuum chamber will vary depending on the specific operation. In a preferred embodiment, the pressure is about $10^{-5}$ Torr. Film 18 is generally loaded on the feed roll 14, and the feed roll 14 is then rotated by a conventional manner to transfer the film 18 to the take up roll 16. Depending on the requirements of the system, a multitude of transfer rollers 15 may be employed in order to transfer the film 18 from the feed roll 14 to the take up roll 16. Additionally, the system 10 may have a plurality of mounts 17. The mounts may be detents or similar structure that are used to direct or guide the film as it is transferred between rolls. The film may be an embossable film, such as mylar.

A viewing window 11 may be disposed on the periphery of the vacuum chamber 12. The viewing window 11 permits an operator to visually check the operation of the system 10.

Figure 2:
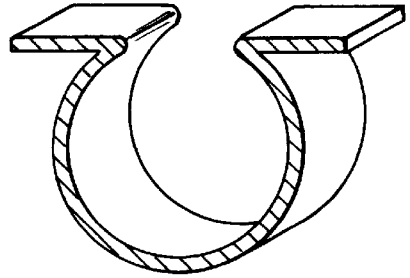
FIG. 2 is an isometric view of a component of the systems and apparatuses depicted in FIGS. 1 and 4.

The system also preferably includes a vaporizer 22, as depicted in FIGS. 1 and 2. Connected to the vaporizer 22 may be a heating supply 20, and disposed within the vaporizer 22 may be a depositing material 44. Although numerous heating supplies 20 may be employed, conventionally either electrical resistance is preferred. As is shown in FIG. 1, the vaporizer 22 is generally disposed in the vacuum chamber 12 below the film 18. In operation, heat is supplied from the heating supply 20 to the vaporizer 22. Heat is then conducted, as discussed in further detail below, to the depositing material 44. The depositing material 44 is heated and vaporizes. Upon vaporizing the depositing material 44 diffuses in an upward direction to the film 18, as it is being transferred from the feed roll 14 to the take up roll 16.

The depositing material 44 then deposits on the film 18 to form a refraction layer.

A variety of materials may be used as the depositing material 44. In a most preferred embodiment, zinc sulfide pellets comprise the depositing material. These zinc sulfide pellets or tablets are available from EM Industries of Damstadt Germany. As is shown in FIG. 2 the vaporizer 22 is mounted within a support structure 28. The vaporizer 22 is preferably constructed from a molybdenum alloy or another material that has sufficient thermal transfer characteristics, as well as sufficient strength and flexibility. A substantial portion of the periphery of the vaporizer 22 is thermally insulated with a conventional material, such as that used in fire boxes. The insulation 30 is disposed between the vaporizer 22 and the support structure 28. The support structure 28 is preferably constructed of a material with good heat transfer characteristics, such as copper. Included with the support structure 28 are two retainers 24. The retainers 24 may each include contact blocks 25 and bolts 26. Each retainer functions to hold a lip 34 of the vaporizer 22 and is also used to vary the width of the aperture 32 of the vaporizer 22. More particularly, the lip 34 is disposed between the contact blocks 25 and the support structure 28. A fastening means then is employed to fasten the contact blocks 25 to the support structure 28. In doing so the lips 34 are clamped between the contact blocks 25 and the support structure 28.

As is depicted, a portion of the lips 34 of the vaporizer 22 are clamped under the retainers 24. By varying the amount of the lip 34 that is in the retainers 24 the size of the aperture 32 of the vaporizer 22 can be adjusted. For instance, as mentioned above the vaporizer 22 is constructed from a material that is flexible, yet strong. Therefore, in order to create a larger aperture 32, the vaporizer 22 can be flexed or bent outward before it is inserted in the retainer 24. By flexing the vaporizer 22, in the outward direction, the size of the aperture 32 increases. The vaporizer can then be held in this position and inserted against the insulation 30. Since the insulation 30 is generally compressible, it can be compressed to conform to the shape of the vaporizer 22. While still holding the vaporizer 22 in the desired shape with the desired size of the aperture, the lips 34 of the vaporizer can then be clamped by the retainers 24. Since the vaporizer 22 has been flexed outward it will be appreciated, that a larger amount of the lips 34 will be clamped by the respective retainers 24.

In order to decrease the cross-sectioned area of the aperture 32, the vaporizer can be bent in an inward direction at the top. As the vaporizer 22 is bent inward, it will move away from the insulation 30, and a larger amount of insulation 30 may have to be inserted prior to placing the vaporizer 22 in place. After the vaporizer 22 has been deformed and inserted, the lips 34 of the vaporizer 22 can be clamped with their respective retainers 24.

The adjustment of the size of the aperture 32 may occur before operation of the system 10. After adjusting the size of the aperture 32, the vaporizer 22 can then be installed and clamped by the retainers 24. In order to adjust the flow rate after assembly, the vaporizer 22 can be removed from the system 10, adjusted and reinstalled in the system 10.

In summary, in order to create a larger aperture 32 the amount of the lips 34 retained within the retainers 34 can be increased and thereby increase the size of the aperture 32. Conversely the amount of the lips 34 in the retainers 24 can be decreased and the size of the aperture 32 is thereby decreased. In a preferred embodiment of this invention, the aperture is set between 1.25 inches and 2 inches.

The vaporizer 22 has a cross section that is substantially circular with the exception of the aperture 32. The aperture 32 preferably extends from one axial end of the vaporizer 22 to the other, as shown in FIG. 2. However, other shapes may be encompassed by this invention. Including those having a plurality of apertures disposed on the top, as opposed to a single aperture. By having a circular cross section, the width of the vaporizer 22 narrows as it approaches the aperture 32. By narrowing the width of the vaporizer 22, the vapor formed from the depositing material 44 is funneled as it transfers upward towards the aperture 32. Because the vapor is funneled as it exits the aperture 32, it diffuses in a general upward direction towards the film and deposits on the film 18.

This structure should be contrasted with prior art structures that employ crucibles which are bowl like and do not funnel the vapor. In these structures the vapor diffuses outward in addition to upward, and therefore, the rate at which the vapor deposits on the film 18 is limited. This in turn limits the rate at which the film can be fed from the feed roll to the take up roll and the corresponding systems production rate of film in conventional systems. The feed rate of the film in conventional systems is about 40 fpm, and in some systems a feed rate of about 600 fpm has been achieved. Because in this system the vapor is funneled in an upward direction and the size of the aperture 32 can be varied to achieve the proper flow rate of vapor, feed rates of up to about 1500 fpm have been achieved. As is evident, this is a significant increase over the prior art systems.

Another advantage of the vaporizer 22 of this invention is that it prevents a crusty layer of zinc sulfide from being created, and thereby prevents or limits the flow of vapor from the vaporizer 22. As the zinc sulfide is heated it tends to become crusty. In prior art bowl like crucibles with cylindrical shapes and straight sides, the sulfide tends to form a crusty layer across the top of these crucibles. As this layer forms, flow of vapor is limited, as is the feed rate of film. Production must then be halted and maintenance performed to remove the crusty layer and increase production rates. This is inefficient and costly. The formation of a crusty layer is prevented by the curved sides of the vaporizer 22 and its circular cross section. In this structure the zinc sulfide at the top falls towards the center of the vaporizer as it becomes crusty and thereby a crusty layer is prevented from forming across the width of the vaporizer 22.

Upon heating zinc sulfide tablets they tend to pop and to be expelled from the vaporizer 22 through the aperture 32. In order to prevent the tablets from being expelled from the vaporizer 22, a screen 52 or similar structure may be disposed above the aperture 32. Upon popping or exiting the vaporizer 22 the tablets will hit the screen 52 and be deflected back into the vaporizer 22. A screen is preferred because it restrains the zinc sulfide, yet at the same time allows diffusion of vapor up to the film 18.

Shutters 42 or a gate like structure may also be used in this invention. These shutters 42 can be opened and closed in a conventional manner and are disposed between the vaporizer 22 and the film 18. Initially, upon starting this system 10 the shutters 42 are closed. The depositing material 44 is then heated. Once the depositing material 44 reaches the operational temperature and vapor is produced in sufficient quantity, the shutters 42 are then opened to allow the vapor to defuse upward and contact the film. Thus, the shutters ensure that the vapor does not begin to deposit on the film 18 until it is being produced at a sufficient rate relative to the rate at which film 18 is being transferred from the feed roll 14 to the transfer roll 15. If the vapor defused upward before it is being produced at a sufficient rate, it would not produce a layer of the proper thickness along the film 18 at the operational feed rate.

Because the shutters 42 are disposed between the film 18 and the vaporizer 22, they also accomplish two other functions. When the system is not operating and the film is not being transferred, the shutters 42 are closed to prevent heat from being applied continuously to the stationary film. If heat was applied continuously to the film, while it is not being transferred, it could ignite and burn. When the shutters 42 are open, they also assist in regulating the flow of vapor produced by the vaporizer. In particular, they assist in directing the flow of vapor up to the film and prevent if from diffusing outward and away from the film. By directing the flow in this manner, they assist in maximizing the vapor deposition rate and the feed rate of the film.

Shields 36 may also be disposed on the exterior of the vaporizer 22. The shields function to prevent heat from being radiated from the support structure 28. Furthermore, the shields may prevent any vapor that is defused outward from defusing down and out as opposed to an upward direction. The support structure 28 is preferably cooled with a typical cooling system 38. Such a cooling system generally includes conduits and a coolant such as water, that continuously flows through the cooling structure and around the shields 36 to provide cooling. The coolant then travels through a heat exchanger where heat is transferred to another medium and continuously functions in this manner to provide cooling for the system.

The vaporizer 22 and supporting structure 28 may be formed into several assemblies commonly referred to as "boat assemblies." Each of the assemblies includes the components discussed above, such as, a vaporizer 22, a heating supply 20 and retainers 24. The boat assemblies are then aligned axially, so that the cross sections of the vaporizer 22 are aligned. They may then be fasten together with bolts or other conventional fasteners. When fastened together, they form a vaporizer 22 that extends under the width of the film 18.

Figure 3:
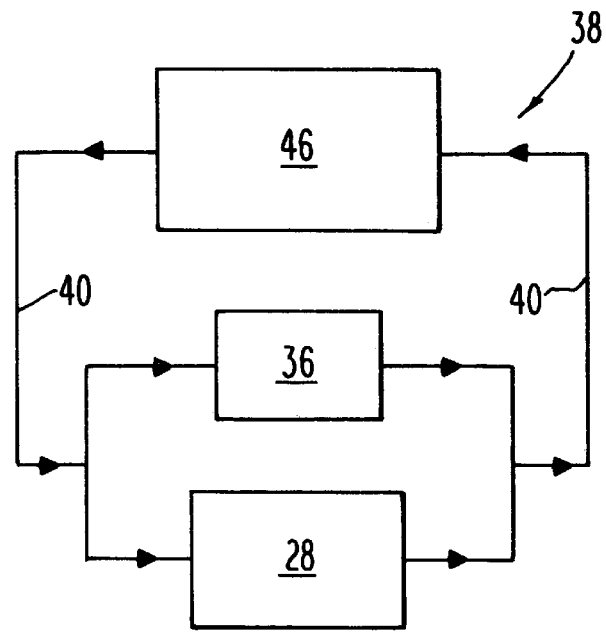
FIG. 3 is a schematic diagram of a cooling system for the systems and apparatuses depicted in FIGS. 1 and 4.

The system 10 may also include a cooling system 38. Such a system 38 typically includes conduits 40 running through the support structure 28 and around the shields 36, and is depicted schematically in FIG. 3. The cooling system may also include a heat exchanger 46. Water or another suitable fluid may be used as the coolant. As the coolant travels through the conduits, heat is transferred from the shields 36 and the support structure 28 to the coolant. The heated coolant than travels to the heat exchanger 46, where heat is transferred from the coolant to another medium. The coolant continuously flows in this manner to provide cooling to the system 10.

As mentioned above, the heating supply 20 is preferably either electrical resistance or inductance heat. Through a conventional electrical connection 50 and a resistance heating element 48, the heating supply 20 is connected to the support structure 28. As the electricity flows to the resistor 48 or similar structure, heat is generated. The heat is then conducted to the support structure 28. Through thermal conductance, heat is then transferred through the retainers 24 to the vaporizer 22. Through conductance and convection, the depositing material 44 is then heated. It will be appreciated that although only two electrical conductors 50 and heating elements 48 are illustrated in FIG. 1, the system 10 of this invention may have a plurality of electrical conductors 50 and heating elements 48 connected to the support structure 28. In a preferred embodiment, the connections 50 and heating elements 48 are disposed axially on either side of the vaporizer 22.

Figure 4:
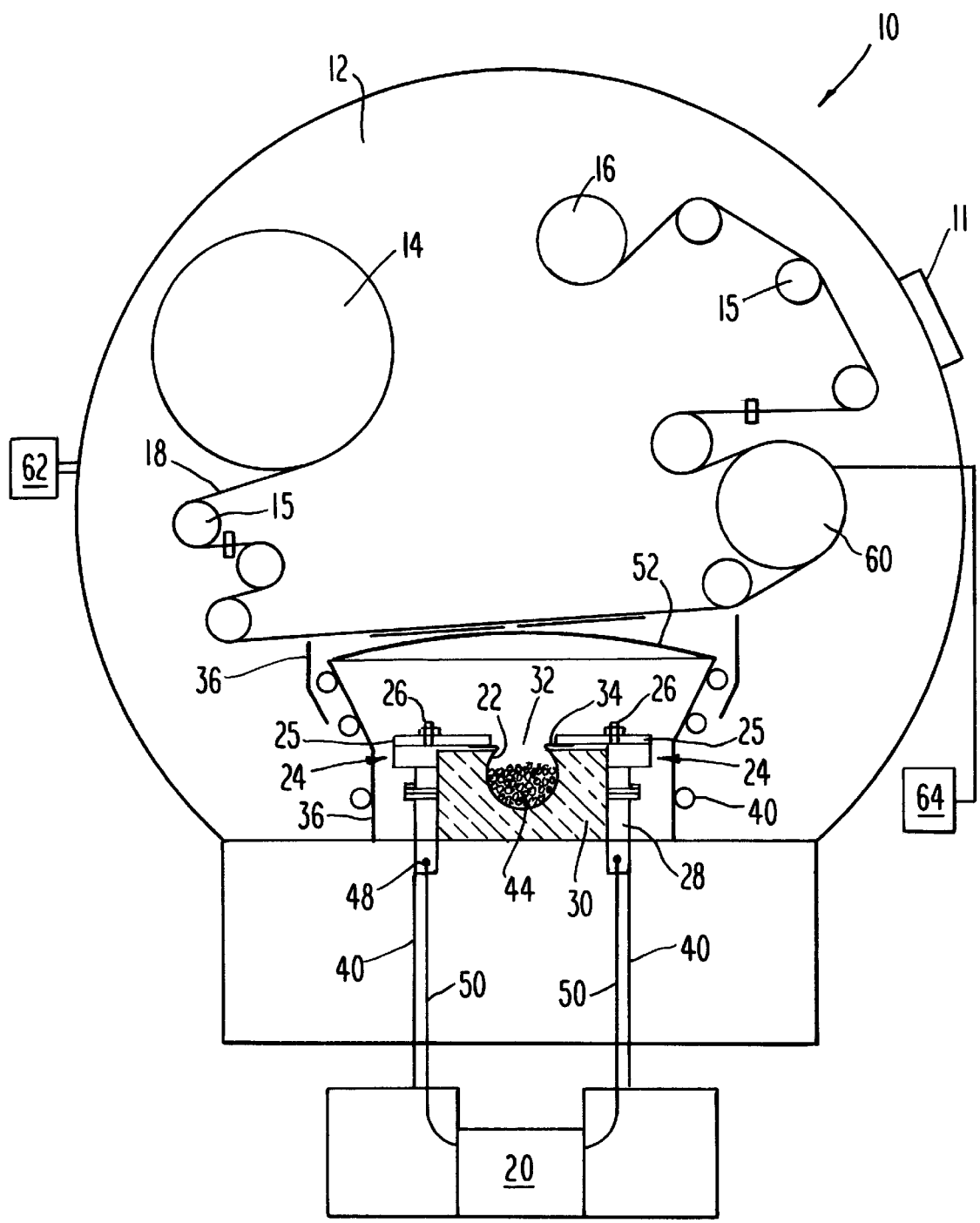
FIG. 4 is a diagrammatical sketch of a system and an apparatus according to another preferred embodiment of this invention.

As shown in FIG. 1 is the system 10 may have a cooling drum 60 that is in communication with a film cooling system 64. This cooling system is prior art, but it may be employed in the system 10 of this invention. The film cooling system 64, shown schematically in FIG. 4, may have a heat exchanger 66, a compressor 68, a temperature sensor 70 and a controller 72. Flowing through the film cooling system 64 may be a coolant, which in a preferred embodiment is Freon. The heat exchanger 66 may have water 71 or another fluid running though it and in thermal contact with the coolant to remove heat from the coolant. The compressor 68 pressurizes the coolant to cause it to flow from the seen exchanger to the cooling drum 60. As can be seen in FIG. 1, the cooling drum 60 has film 18 disposed running around a portion of its circumference. The coolant runs through the cooling drum 60 and absorbs heat from the film 18. From the cooling drum 60, the coolant returns to the heat exchanger 66 where it is cooled. The coolant is then pressurized by the compressor 68 and flows in this closed loop system to continuously cool the film 18.

This cooling system 64 may employ an automatic controller 72 and a sensor 70. This sensor 70 is a conventional measuring device that preferably measures the temperature of the coolant exiting the heat exchanger and inputs this measured temperature to the controller 72. The controller 72 may be a typical electrical controller that compares the measured temperature to a predetermined temperature to provide adequate cooling to the cooling drum 60. After comparing these temperatures, the controller 72 responds in a conventional manner to vary the flow of heat absorbing fluid running through the heat exchanger 66 to obtain the desired temperature of the coolant. The temperature of the coolant may also be controlled through manual operation of valves and the like to vary the flow rate of the fluids through the heat exchanger.

Figure 5:
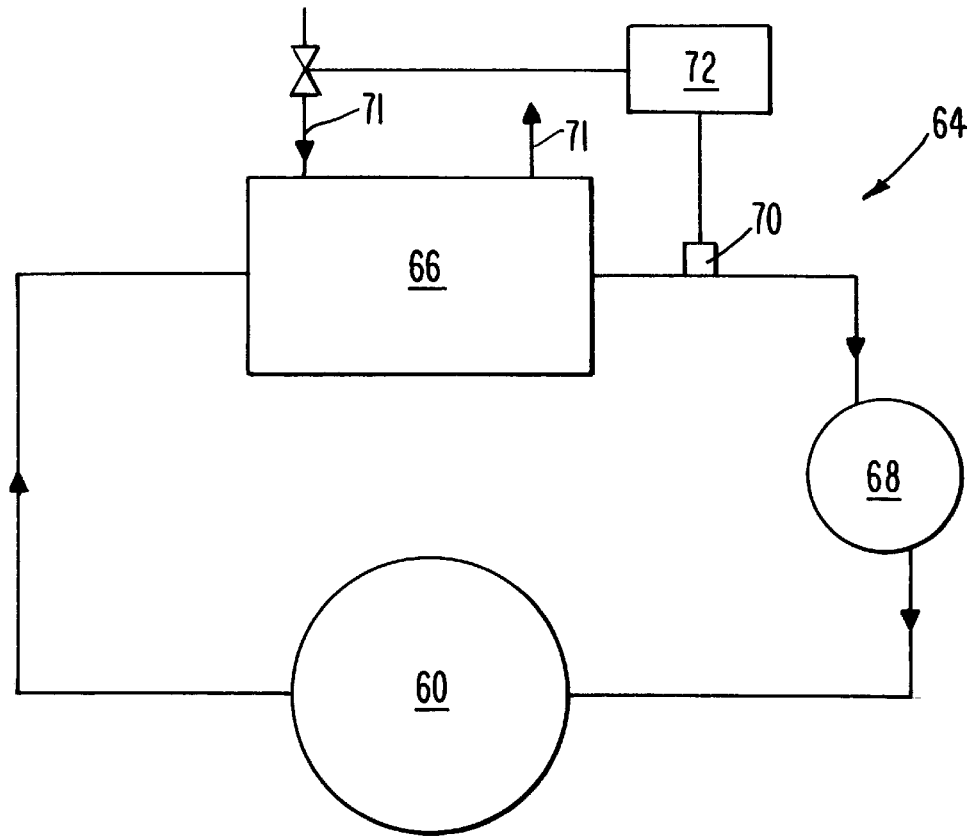
FIG. 5 is a schematic diagram of another cooling system for the systems of FIGS. 1 and 4.

FIG. 5 depicts another preferred embodiment of the system 10 of this invention. The preferred embodiment depicted in FIG. 5 is similar to that of FIG. 1. However, in contrast to the preferred embodiment of the system 10 illustrated in FIG. 1, the cooling drum 60 is not disposed directly above the vaporizer 22 in the embodiment of this system 10 shown in FIG. 5. Rather, the cooling drum 60 is disposed so that it receives film 18 after it has been fed across the top of the vaporizer 22. Since the cooling drum 60 cools the film as is described above, the location of the cooling drum 60 may have an effect on the deposition rate and hence the feed rate of the film.

In addition, it has been found that the zinc pellets tend to pop out of the vaporizer when heated. If the pellets are not stopped by the screen 52, they may contact the film 18. Upon contacting the film, the relatively hot zinc pellets may cause thermal damage to the film. In order to minimize or prevent thermal damage, the cooling drum 60 is disposed, as shown in FIG. 1, directly over the vaporizer 22. In this position, when a zinc sulfide pellet contacts the film disposed around the cooling drum 60, the cooling drum 60 absorbs the heat and transfers it to the film cooling system 64.

It is to be understood, however, that even though numerous characteristics and advantages of the present invention has been set forth in the foregoing description, together with details of the structure and function of the invention, the disclosure is illustrative only, and changes may be made to detail, especially in matters of shape, size and arrangement of parts within the principals of the invention to the full extent indicated by the broad general meaning of the terms in which the appended claims are expressed.

What is claimed is:

1. An apparatus for the manufacture of a polymer film onto which a refractive index layer has been deposited by heating a deposition material to form a deposition vapor that is deposited onto the polymer film, comprising:

a vacuum chamber;

a feed roll, disposed within the vacuum chamber and around which the polymer film is disposed;

a take-up roll, disposed within the vacuum chamber, the polymer film extending from the feed roll to the take-up roll and being moveable from the feed roll to the take up roll as the deposition vapor is deposited on the polymer film;

a vaporizer, disposed below the feed roll and the take-up roll, the vaporizer having (i) a flexible wall that defines a cavity in which the deposition material is heated to form the vapor for depositing on the polymer film as the polymer film is moved from the feed roll to the take-up roll, (ii) a first lip extending outward from a first side of the wall and (iii) a second lip extending outward from a second side of the wall, the first lip and the second lip being separated to define an aperture through which the deposition vapor flows when the deposition material is vaporized, a size of the aperture being adjustable by adjusting the distance of separation between the first lip and the second lip; and a heat source in thermal communication with the vaporizer to form the deposition vapor.

2. The apparatus of claim 1, wherein the heat source comprises electrical resistance.

3. The apparatus of claim 1, further comprising a support structure disposed beneath and around the vaporizer that mechanically supports the vaporizer, a first contact block mounted to the support structure with at least a portion of the first lip being retained between the first contact block and the support structure and a second contact block mounted to the support structure with at least a portion of the second lip being retained between the second contact block and the support structure, the size of aperture being adjustable by adjusting the amount of the portion of the first lip that is retained between the first contact block and the support structure and the amount of the second lip that is retained between the second contact block and the support structure.

4. The apparatus of claim 1, further comprising a support structure upon which the vaporizer is mounted and that conducts heat from the heat source to the vaporizer.

5. The apparatus of claim 1, further comprising thermal insulation mounted around a periphery of the vaporizer.

6. The apparatus of claim 1, wherein the wall of the vaporizer has a cross section that is substantially curved.

7. The apparatus of claim 1, further comprising shields disposed about a periphery of the vaporizer that deflects vapor produced by the deposition material to the film.

8. The apparatus of claim 1, wherein the vaporizer comprises a molybdenum alloy.

9. A system for heating a deposition material to form a vapor that may be deposited on a polymer film, comprising:

a vacuum chamber in which the deposition material is heated;

a feed roll and a take up roll disposed within the vacuum chamber, the polymer film being disposed around the feed roll and the take-up roll and being moveable from the feed roll to the take-up roll, so that vapor is deposited on the polymer film as the polymer film moves between the feed roll and the take-up roll; and a vaporizer disposed within the vacuum chamber to heat the deposition material to form the vapor which deposits on the film being transferred from the feed roll to the take up roll, the vaporizer comprising a flexible sheet of metal that defines (i) a first lip that extends outward in a first direction, (ii) a wall that forms a cavity in which the deposition material is retained and (iii) a second lip that extends outward in a second direction that opposes the first direction, the first lip and the second lip being separated to define an aperture through which vapor flows so that the vapor is deposited on the polymer film; a size of the aperture being adjustable to vary the flow rate of vapor through the aperture and thereby the deposition rate on the polymer film by adjusting the separation between the first lip and second lip.

10. The system of claim 9, wherein the film can be transferred from the feed roll to the take up roll at a rate of about 1500 feet per minute while the vapor is being deposited on the film.

11. The system of claim 9, wherein the vaporizer further comprises a substantially curved cross section.

12. The system of claim 9, further comprising a shutter disposed between the vaporizer and the film that can be closed when the deposition material is being initially heated and opened when the deposition material has been heated to form the vapor for deposition on the polymer film.

13. The system of claim 9, further comprising a screen disposed over the aperture of the vaporizer to prevent the deposition material from exiting the cavity when the deposition material is heated.

14. The system of claim 9, further comprising a support structure disposed around the wall of the vaporizer.

15. The system of claim 14, further comprising a first contact block, that is mounted to the support structure, with at least a portion of the first lip disposed between the first contact block and the support structure and a second contact block, that is mounted to the support structure, with at least a portion of the second lip disposed between the second contact block and the support structure, the size of the aperture being adjustable by adjusting the portion of the first contact block disposed between the first lip and the first contact block and by adjusting the portion of the second contact block disposed between the second contact block and the support structure.

16. A system for heating a deposition material to form a vapor that may be deposited on a polymer film, comprising:

a vacuum chamber in which the deposition material is heated;

a feed roll and a take up roll disposed within the vacuum chamber, the polymer film being disposed around the feed roll and the take-up roll and being moveable from the feed roll to the take-up roll, so that vapor is deposited on the polymer film as the polymer film moves between the feed roll and the take-up roll;

a vaporizer disposed within the vacuum chamber for heating the deposition material to form the vapor which deposits on the film being transferred from the feed roll to the take up roll, the vaporizer comprising a sheet of metal that defines (i) a first lip that extends outward in a first direction, (ii) a flexible wall that forms a cavity in which the deposition material is retained and (iii) a second lip that extends outward in a second direction that opposes the first direction, the first lip and the second lip being separated to define an aperture through which vapor flows so that the vapor is deposited on the polymer film; the size of the aperture being adjustable to vary the flow rate of vapor through the aperture and thereby the deposition rate on the polymer film by adjusting the separation between the first lip and second lip;

a support structure disposed around the wall for supporting the vaporizer;

a first contact block, that is mounted to the support structure, with at least a portion of the first lip disposed between the first contact block and the support structure; and a second contact block, that is mounted to the support structure, with at least a portion of the second lip disposed between the second contact block and the support structure, the size of the aperture being adjustable by adjusting the portion of the first contact block disposed between the first lip and the first contact block and by adjusting the portion of the second contact block disposed between the second contact block and the support structure.

17. The system of claim 16, further comprising insulation disposed between the support structure and the wall.

18. The system of claim 17, further comprising a screen disposed over the aperture and connected to the support structure that prevents deposition material from traveling through the aperture when the deposition material is heated.

19. The system of claim 17, wherein the wall, the first lip and the second lip comprise a molybdenum alloy.

20. The system of claim 16, further comprising an electrical heater in thermal communication with the vaporizer for vaporizing the deposition material.

21. The system of claim 16, further comprising a shutter disposed over the vaporizer and below the take-up roll and the feed roll, the shutter being moveable between a closed position and an open position, the shutter being disposed in the closed position when the deposition material is being heated and in the open position when the deposition material has been heated sufficiently to form the vapor for depositing on the film.

* * * * *